United States Patent
Miura et al.

(10) Patent No.: US 8,791,702 B2
(45) Date of Patent: Jul. 29, 2014

(54) GROUND FAULT DETECTION CIRCUIT, AND POWER SUPPLY DEVICE

(75) Inventors: Hikaru Miura, Hitachinaka (JP); Akihiko Kudou, Hitachinaka (JP)

(73) Assignees: Hitachi, Ltd., Tokyo (JP); Hitachi Vehicle Energy, Ltd., Hitachinaka-shi (JP)

( * ) Notice: Subject to any disclaimer, the term of this patent is extended or adjusted under 35 U.S.C. 154(b) by 329 days.

(21) Appl. No.: 13/256,386

(22) PCT Filed: Aug. 11, 2010

(86) PCT No.: PCT/JP2010/063651
§ 371 (c)(1),
(2), (4) Date: Oct. 27, 2011

(87) PCT Pub. No.: WO2011/040128
PCT Pub. Date: Apr. 7, 2011

(65) Prior Publication Data
US 2012/0043967 A1    Feb. 23, 2012

(30) Foreign Application Priority Data

Sep. 29, 2009   (JP) ................................ 2009-225131

(51) Int. Cl.
*G01N 27/416* (2006.01)
*H02J 7/00* (2006.01)

(52) U.S. Cl.
USPC ........... 324/426; 324/430; 324/436; 320/134; 320/136

(58) Field of Classification Search
CPC .................................................. G01R 31/3648
USPC ....................................................... 324/426
See application file for complete search history.

(56) References Cited

U.S. PATENT DOCUMENTS

2006/0233004 A1    10/2006    Furukawa et al.
2008/0054907 A1    3/2008    Kudo et al.

FOREIGN PATENT DOCUMENTS

| JP | 2001-330643 | * | 11/2001 | ............. G01R 31/14 |
| JP | 2003-255012 | A | 9/2003 | |
| JP | 2004-347372 | A | 12/2004 | |
| JP | 2005-156371 | A | 6/2005 | |
| JP | 2006-280171 | A | 10/2006 | |
| JP | 2007-057490 | * | 3/2007 | ............. G01R 31/02 |
| JP | 2007-57490 | A | 3/2007 | |
| JP | 4035942 | B2 | 11/2007 | |
| JP | 2008-64536 | | 3/2008 | |

OTHER PUBLICATIONS

International Search Report including English language translation dated Sep. 14, 2010 (Four (4) pages).

* cited by examiner

*Primary Examiner* — Edward Tso
*Assistant Examiner* — Ahmed Omar
(74) *Attorney, Agent, or Firm* — Crowell & Moring LLP

(57) ABSTRACT

A ground fault detection circuit according to the present invention is a ground fault detection circuit that detects the occurrence of a ground fault of a battery that is insulated, and that includes: an AC signal generation section that generates an AC signal; a first capacitive element that couples the AC signal generated by the AC signal generation section to the battery; a voltage division section that voltage divides the AC signal that is coupled to the battery by the first capacitive element; a ground fault detection unit that detects a ground fault of the battery based on an AC component of an input signal; and a second capacitive element that couples the AC signal that has been voltage divided by the voltage division section to the ground fault detection unit as the input signal.

7 Claims, 3 Drawing Sheets

GROUND FAULT DETECTION CIRCUIT, AND POWER SUPPLY DEVICE

TECHNICAL FIELD

The present invention relates to a ground fault detection circuit and to a power supply device.

BACKGROUND ART

A battery that is mounted to an electric automobile or the like is insulated from the vehicle body. When a ground fault occurs with the battery, the danger of electric shock due to the battery becomes high. Accordingly, circuits of various types have been proposed for detecting when the battery suffers a ground fault. For example, in Patent Document #1, there is described an insulation deterioration detection device in which, along with an AC oscillation circuit being connected to a high voltage battery via a first capacitor, a comparison circuit is also connected to the high voltage battery via a second capacitor. This insulation deterioration detection device detects that electrical leakage of the high voltage battery (that is insulated) is occurring by the comparison circuit comparing together an AC signal from the AC oscillation circuit and an AC signal that is inputted via the second capacitor.

CITATION LIST

Patent Literature

Patent Document #1: Patent Publication U.S. Pat. No. 4,035,942.

SUMMARY OF INVENTION

Technical Problem

With a prior art leakage detection circuit, there has been the problem that there is an interval in which it is not possible to detect a ground fault, due to the transient response when a ground fault occurs.

Solution to Problem

According to the 1st aspect of the present invention, a ground fault detection circuit that detects the occurrence of a ground fault of a battery that is insulated, comprises: an AC signal generation section that generates an AC signal; a first capacitive element that couples the AC signal generated by the AC signal generation section to the battery; a voltage division section that voltage divides the AC signal that is coupled to the battery by the first capacitive element; a ground fault detection unit that detects a ground fault of the battery based on an AC component of an input signal; and a second capacitive element that couples the AC signal that has been voltage divided by the voltage division section to the ground fault detection unit as the input signal.

According to the 2nd aspect of the present invention, in a ground fault detection circuit according to the 1st aspect, it is preferred that the ground fault detection circuit further comprises a battery voltage detection unit that detects a voltage of the battery, and that the voltage division section is part of the battery voltage detection unit.

According to the 3rd aspect of the present invention, a power supply device comprises a ground fault detection circuit according to the 1st or 2nd aspect, and a battery controller that manages the battery, that is an assembled battery comprising a plurality of battery cells.

According to the 4th aspect of the present invention, in a power supply device according to the 3rd aspect, it is preferred that the power supply device further comprises a relay that connects the battery and a load that is driven by the battery, and wherein the battery controller controls the relay to separate the battery and the load, upon detection of a ground fault of the battery by the ground fault detection unit.

According to the 5th aspect of the present invention, in a ground fault detection circuit according to the 1st or 2nd aspect, it is preferred that the AC signal that has been applied to the battery via the first capacitive element and that has been voltage divided together with the voltage of the battery by the voltage division section is extracted from the battery by the second capacitive element.

According to the 6th aspect of the present invention, in a ground fault detection circuit according to the 1st or 2nd aspect, it is preferred that the AC signal voltage divided by the voltage division section is inputted to the ground fault detection unit via the second capacitive element, in which the AC signal generated by the AC signal generation section is superimposed upon the voltage of the battery by being coupled to the battery by the first capacitive element, is voltage divided by the voltage division section.

Advantageous Effects of Invention

According to the present invention, it is possible to shorten the interval in which it is not possible to detect a ground fault.

DESCRIPTION OF EMBODIMENTS

Embodiment 1

Figure 1:
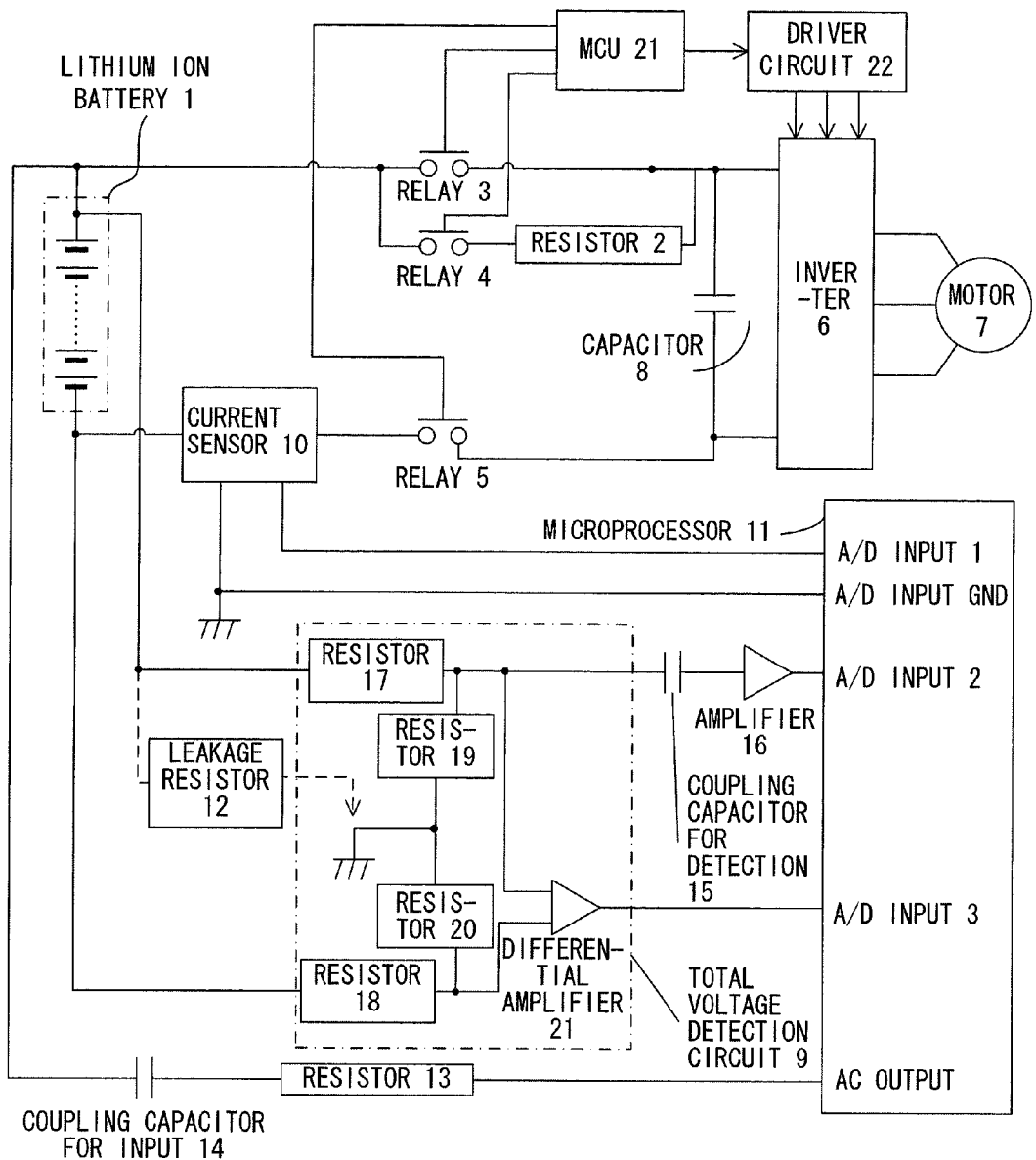
FIG. 1 is a figure showing the structure of a power supply device according to an embodiment of the present invention.

FIG. 1 is a figure showing the structure of a power supply device according to an embodiment of the present invention. This power supply device is mounted to a vehicle such as an electric automobile or a hybrid automobile or the like, and performs charge/discharge control of a lithium ion battery 1 when the battery 1 is powering a motor 7 of the vehicle, and when the battery 1 is recuperating regenerated electrical power generated by the motor 7.

The lithium ion battery 1 is insulated from the vehicle body. The power supply device according to this embodiment includes a leakage detection circuit. This leakage detection circuit detects when electrical leakage is occurring, for example due to the fact that the insulation between the lithium ion battery 1 and the vehicle body has deteriorated.

This power supply device 1 comprises a resistor 2, relays 3 through 5, an inverter 6, an MCU 21, a driver circuit 22, a capacitor 8, a total voltage detection circuit 9, a current sensor 10, a microprocessor 11, a resistor 13, coupling capacitors 14 and 15, and an amplifier 16.

The lithium ion battery 1 includes a plurality of lithium cells connected in series, for example 96 cells, in which a manganese type material is used for the positive electrodes and an amorphous carbon type material is used for the negative electrodes. The rated capacity of each of the cells of this lithium ion battery may, for example, be 5.5 Ah, and its rated voltage may, for example, be 3.6 V.

The lithium ion battery 1 and the inverter 6 are connected together via the relays 3 through 5. The relays 3 through 5 are controlled to change over between ON and OFF by the MCU 21 that is controlling the inverter 6. The capacitor 8, that is of high capacity, is connected to the input terminal side of the inverter 6, and serves for smoothing the charge/discharge current, that is in pulse form. The resistor 2 for prevention of sudden inflow of current is provided between the lithium ion battery 1 and the inverter 6. This resistor 2 has a resistance value of, for example, 390Ω. When supply of current from the lithium ion battery 1 to the inverter 6 is started, the lithium ion battery 1 and the inverter 6 are connected via the resistor 2 by closing the relays 4 and 5. Due to this, sudden inflow of current flowing to the capacitor 8 is limited, and thereby the contact points of the relays 3 through 5 are protected. Thereafter, by closing the relay 3 and opening the relay 4, the lithium ion battery 1 and the inverter 6 are connected together, not via the resistor 2. The lithium ion battery 1 and the inverter 6 are connected together by the relays 3 through 5 in this manner.

The inverter 6 is connected to the motor 7 that is mounted to the vehicle, and converts DC electrical power outputted from the lithium ion battery 1 to three phase AC electrical power that is outputted to the motor 7 and drives the motor 7. Moreover, regenerated electrical power generated when the motor 7 acts as a generator is converted by the inverter 6 into DC electrical power that is outputted to the lithium ion battery 1 and charges up the lithium ion battery 1. In other words, the inverter 6 has bidirectional type input and output characteristics, and functions as a charge/discharge load for the lithium ion battery 1.

The total voltage detection circuit 9 detects the total voltage of the lithium ion battery 1, and outputs a voltage value corresponding to this detected value as a voltage detection signal. This total voltage detection circuit 9 includes resistors 17 through 20 and a differential amplifier 21. The voltage detection signal outputted from the total voltage detection circuit 9 is outputted from the differential amplifier 21. The current sensor 10 detects the current inputted to or outputted from the lithium ion battery 1, and outputs a voltage value corresponding to this detected value as a current detection signal. The detection signals outputted from the total voltage detection circuit 9 and from the current sensor 10 are respectively inputted to A/D input terminals 1 and 3 of the microprocessor 11.

The terminal at the high electrical potential side of the lithium ion battery 1 is connected to the A/D input terminal 2 of the microprocessor 11 via the resistor 17 within the total voltage detection circuit 9, the coupling capacitor for detection 15, and the amplifier 16. This signal at the A/D input terminal 2 is voltage divided by the resistors 17 through 20. Accordingly, it is acceptable for the withstand voltage of the coupling capacitor for detection 15 to be low.

The microprocessor 11 is a battery controller that manages this power supply device as a whole, including the lithium ion battery 1. This microprocessor 11 includes an oscillation circuit. This oscillation circuit generates a square wave having, for example, amplitude 0 to 5 V and frequency 10 Hz, and outputs this square wave from its AC output terminal. The AC output terminal of the microprocessor is connected via the resistor 13 and the coupling capacitor for input 14 to the terminal on the high voltage side of the lithium ion battery 1.

The microprocessor 11 further includes an A/D converter. The detection signals from the total voltage detection circuit 9 and from the current sensor 10, and also the output from the amplifier 16, are inputted to this A/D converter of the microprocessor 11 via the A/D input terminals 1 through 3. The A/D converter measures these signals within a predetermined measurement range, for example a measurement range of 0 to 5 V, and converts them to digital values. On the basis of these measured values after digital conversion, the microprocessor 11 measures the total voltage and the input or output current of the lithium ion battery 1, and also detects electrical leakage between the lithium ion battery 1 and the vehicle body.

Explanation of the Ground Fault Detection Operation

The voltage supplied to the A/D input terminal 2 of the microprocessor 11 is a voltage upon which is superimposed the AC component of a voltage Vout that is given by the following Equation (1). In this Equation (1), α is a value obtained by multiplying the voltage division ratio of the resistor 19 in the combination of the resistors 17 and 19 by the amplification ratio of the amplifier 16, Vin is the voltage supplied from the AC output terminal of the microprocessor 11, R1 is the resistance value of a leakage resistance 12, R2 is the resistance value of the resistor 13, and Z is the impedance of the coupling capacitor for input 14.

$$Vout \approx \alpha Vin(R1/(R1+R2+Z)) \quad (1)$$

If a leakage resistance 12 is present, in other words if a ground fault is occurring, then the amplitude of the input signal at the A/D input terminal 3 changes according to this Equation (1) above. Accordingly, it is possible for the microprocessor 11 to detect the occurrence of a ground fault. Moreover, if the coupling capacitor for detection 15 has gone into the open state due to a fault or the like, then it is likewise possible for the microprocessor 11 to detect the occurrence of an anomaly, since the signal that appears at the A/D input terminal 3 is different from the signal during normal conditions. And, if the coupling capacitor for input 14 has gone into the open state, then it is likewise possible for the microprocessor 11 to detect the occurrence of an anomaly, since an AC component ceases to be included at the high voltage side of the lithium ion battery 1.

Resistors of sufficiently high resistance values with respect to the chassis GND as seen from the battery side must be used for the voltage division resistors 17 through 20 in the total voltage detection circuit 9. Moreover, the voltage division ratio provided by the resistor combinations 17 and 19, and 18 and 20, is set so that they match one another, and so that, even if one of the terminals of the lithium ion battery 1 is short circuited to GND, the voltage that is obtained is within the voltage range that can be amplified normally by the differential amplifier 21.

The amplification ratio of the amplifier 16 corrects for reduction of amplitude of the AC signal outputted from the microprocessor 11, and is set to an amplification ratio at which it becomes possible adequately detect to a ground fault at the resolving power of the A/D converter of the microprocessor 11. Moreover, When the transient response generated while connecting the relays 3 through 5 is sufficiently stable, and when it is possible adequately to detect a ground fault, this amplification ratio is set so that the input signal does not exceed the input voltage range of the A/D converter of the microprocessor 11 (at the A/D input terminal 2).

Basic Performance of the Present Invention

When the leakage resistance R1 in Equation (1) is zero, in other words when a perfect ground fault for the battery is occurring, Equation (1) may be abbreviated as Equation (2):

$$V_{out}=0 \qquad (2)$$

Figure 2:
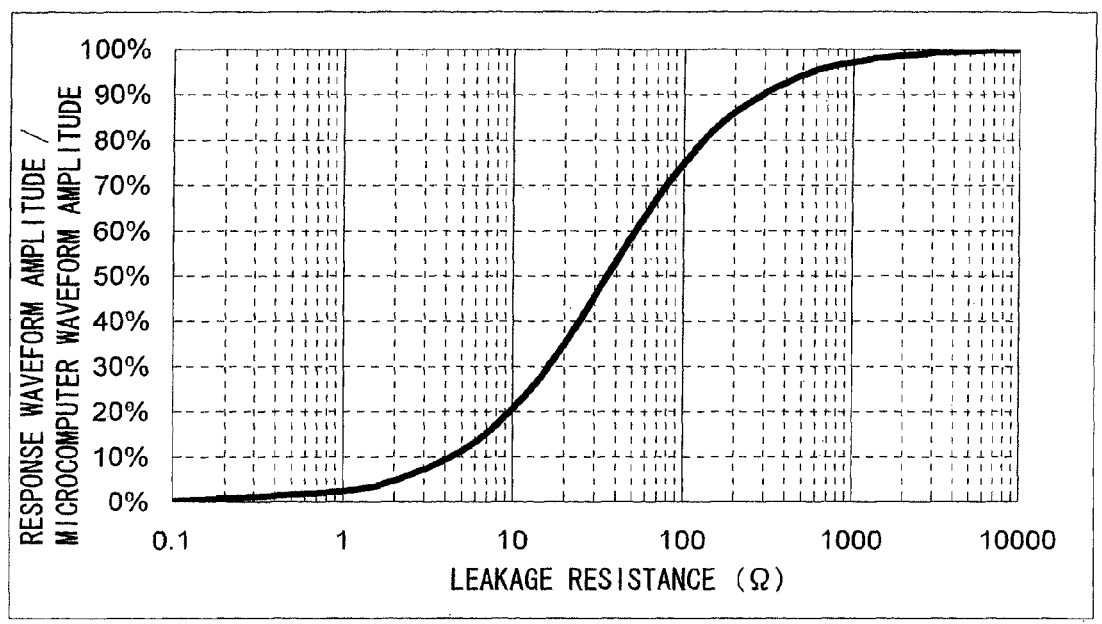
FIG. 2 is a figure showing the relationship between the ratio of voltages Vin and Vout in Equation (1) given subsequently, and leakage resistance.

FIG. 2 is a figure showing the relationship between the ratio of Vin and Vout in Equation (1) and the leakage resistance. With the present invention, it is possible to monitor the insulation resistance value over the entire voltage range applied by Vin, and it is possible to enhance the accuracy of measurement of the insulation resistance.

Figure 3:
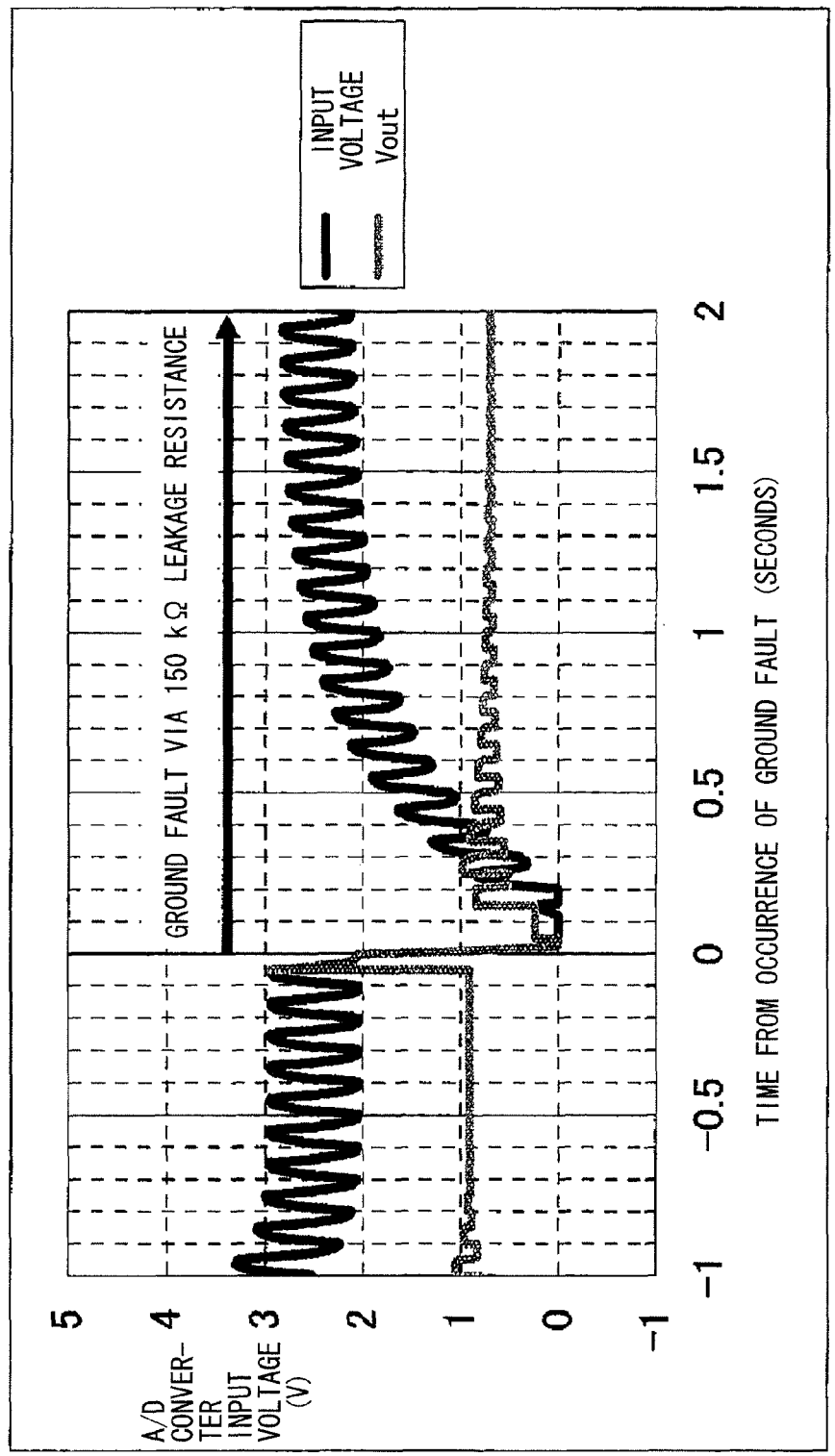
FIG. 3 is an example of a voltage waveform that is supplied to an A/D input terminal 2 of a microprocessor 11, when a ground fault occurs at the positive terminal of a lithium ion battery 1.

FIG. 3 is an example of the voltage waveform that is supplied to the A/D input terminal 2 of the microprocessor 11, when a ground fault occurs at the positive terminal of the lithium ion battery 1. If the input voltage range of the A/D converter is limited to 0-5 V, then sometimes it may happen that Vout becomes outside the input voltage range of the A/D converter, due to voltage fluctuations generated when a ground fault has occurred. With the present invention, the amplitude is monitored from directly after the occurrence of a ground fault by adjusting the amplitude, so that it becomes possible to keep the delay in ground fault detection operation to a minimum.

When the occurrence of a ground fault is detected, the microprocessor 11 cuts off the lithium ion battery 1 and the capacitor 8 from the inverter 6 and the motor 7 by opening the relays 3 through 5. It should be understood that, upon detection of the occurrence of a ground fault, the microprocessor 11 could also perform some operation other than opening the relays 3 through 5. For example, it would be acceptable to arrange to notify the user of the occurrence of a ground fault by illuminating a warning light that is set up in advance, or the like.

With the power supply device according to the first embodiment of the present invention described above, the following beneficial operational effects may be obtained. (1) The microprocessor 11 performs ground fault detection operation on the basis of the AC signal that has been voltage divided by the resistor 17 and the resistor 19. Due to this, since the peak of the input voltage at the A/D input terminal 2, which is corresponding to the peak of the voltage waveform of the transient response when a ground fault occurs, becomes smaller because of this voltage division, accordingly the time interval during which the input voltage range at the A/D input terminal 2 is exceeded becomes short, and thus, along with it being possible to shorten the interval in which detection of a ground fault is not possible, also it becomes possible to employ a capacitor whose withstand voltage is relatively low as the coupling capacitor for detection 15.

(2) The resistors 17 and 19 that voltage divide the AC signal from the AC output terminal are a part of the elements that make up the total voltage detection circuit 9. In other words, the resistor 17 and the resistor 19 are used for voltage dividing the input signal to the A/D input terminal 2, and also for the detection of voltage by the total voltage detection circuit 9. Due to this, it is possible to keep the number of elements added to the circuitry to a minimum.

Within the scope of the present invention and variations thereof described below, one or a plurality of the following variant embodiments may also be combined with the embodiment described above.

Variant Embodiment 1

The present invention can also be applied to a system that is used for charging up a battery other than a lithium ion battery, or to a system that does not employ an inverter and/or a motor, for example a system other than one for an electric automobile or the like.

Variant Embodiment 2

It would also be acceptable to arrange for the output of the amplifier 16 to be inputted to some circuitry and device other than the microprocessor 11. Furthermore, it would also be acceptable for operation corresponding to the detection of a ground fault to be performed by circuitry and device other than the microprocessor 11. For example, it would also be possible to build the power supply device so that the opening of the relays 3 through 5 is performed by the inverter 6.

Provided that the characteristic features of the present invention are not departed from, the present invention is not to be considered as being limited to the embodiments described above; other embodiments that are considered to fall within the scope of the technical concept of the present invention are also included within the range of the present invention.

The content of the disclosure of the following application, upon which priority is claimed, is hereby incorporated herein by reference:

Japanese Patent Application 2009-225131 (filed on 29 Sep. 2009).

The invention claimed is:

1. A ground fault detection circuit that detects the occurrence of a ground fault of a battery that is insulated, comprising:
   an AC signal generation section that generates an AC signal;
   a first capacitive element that couples the AC signal generated by the AC signal generation section to the battery;
   a voltage division section that voltage divides the AC signal that is coupled to the battery by the first capacitive element;
   a ground fault detection unit that detects a ground fault of the battery based on an AC component of an input signal; and
   a second capacitive element that couples the AC signal that has been voltage divided by the voltage division section to the ground fault detection unit as the input signal,
   wherein, the AC signal voltage divided by the voltage division section is inputted to the ground fault detection unit via the second capacitive element, in which the AC signal generated by the AC signal generation section is superimposed upon the voltage of the battery by being coupled to the battery by the first capacitive element, is voltage divided by the voltage division section.

2. A ground fault detection circuit according to claim 1, further comprising a battery voltage detection unit that detects a voltage of the battery, and wherein the voltage division section is part of the battery voltage detection unit.

3. A power supply device, comprising a ground fault detection circuit according to claim 1, and a battery controller that manages the battery, that is an assembled battery comprising a plurality of battery cells.

4. A power supply device according to claim 3, further comprising a relay that connects the battery and a load that is driven by the battery, and wherein the battery controller controls the relay to separate the battery and the load, upon detection of a ground fault of the battery by the ground fault detection unit.

5. A power supply device, comprising a ground fault detection circuit according to claim 2, and a battery controller that manages the battery, that is an assembled battery comprising a plurality of battery cells.

6. A ground fault detection circuit according to claim 1, wherein, the AC signal that has been applied to the battery via the first capacitive element and that has been voltage divided together with the voltage of the battery by the voltage division section is extracted from the battery by the second capacitive element.

7. A ground fault detection circuit according to claim 2, wherein, the AC signal that has been applied to the battery via the first capacitive element and that has been voltage divided together with the voltage of the battery by the voltage division section is extracted from the battery by the second capacitive element.

\* \* \* \* \*